(12) United States Patent
Dicke

(10) Patent No.: US 6,194,923 B1
(45) Date of Patent: *Feb. 27, 2001

(54) FIVE VOLT TOLERANT OUTPUT DRIVER

(75) Inventor: Curtis J. Dicke, Colorado Springs, CO (US)

(73) Assignee: Nvidia Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/727,768

(22) Filed: Oct. 8, 1996

(51) Int. Cl.[7] ........................................ H03K 3/00
(52) U.S. Cl. .................... 327/112; 327/391; 327/312; 327/313; 327/328; 326/24
(58) Field of Search .................. 327/382, 387, 327/389, 391, 312, 313, 327, 328, 112; 326/24, 27; 361/91

(56) References Cited

U.S. PATENT DOCUMENTS

| | | | | |
|---|---|---|---|---|
| 4,539,489 | * | 9/1985 | Vaughn | 327/206 |
| 4,779,013 | * | 10/1988 | Tanaka | 327/374 |
| 4,791,323 | * | 12/1988 | Austin | 326/24 |
| 4,961,015 | * | 10/1990 | Shin et al. | 327/391 |
| 4,963,766 | * | 10/1990 | Lungberg | 326/58 |
| 5,036,222 | * | 7/1991 | Davis | 326/27 |
| 5,124,579 | * | 6/1992 | Naghshineh | 326/27 |
| 5,237,213 | * | 8/1993 | Tanoi | 327/379 |
| 5,451,889 | * | 9/1995 | Heim et al. | 326/81 |
| 5,576,635 | * | 11/1996 | Partovi et al. | 326/27 |
| 5,629,634 | * | 5/1997 | Carl et al. | 326/27 |
| 5,635,861 | * | 6/1997 | Chan et al. | 326/81 |
| 5,650,742 | * | 7/1997 | Hirano | 327/391 |
| 5,789,942 | * | 8/1998 | Mizuno | 326/81 |

* cited by examiner

Primary Examiner—Terry D. Cunningham
(74) Attorney, Agent, or Firm—Oppenheimer, Wolff & Donnelly, LLP; Claude A. S. Hamrick

(57) ABSTRACT

An off-chip driver circuit having a set of input terminals and an output terminal, a pull-up transistor having a controllable path connected between a first power supply and the output terminal of the off-chip driver circuit, a pull-down transistor having a controllable path connected between a second power supply and the output terminal of the off-chip driver circuit, a first controllable path for applying a first voltage at one of the input terminals to a control terminal of the pull-up transistor, the first controllable path functioning in response to voltages at the output terminal below a first value, a second controllable path for applying a second voltage greater than the first voltage to the control terminal of the pull-up transistor, the second controllable path functioning in response to voltages at the output terminal above the first value.

16 Claims, 2 Drawing Sheets

FIVE VOLT TOLERANT OUTPUT DRIVER

BACKGROUND OF THE INVENTION

1. Field of the Invention

This invention relates to electronic systems and, more particularly, to methods and apparatus for providing an off-chip driver circuit implemented in complementary metal oxide silicon (CMOS) technology which has a supply voltage less than the supply voltage of external circuits which may be connected to the output of the driver circuit.

2. History of the Prior Art

In modern day integrated circuits much attention is focused on the design of output driver circuits that must provide signals to various bus types having various loading conditions. An off-chip driver circuit should be designed not only to successfully drive logic levels relating to the supply voltage of the off-chip circuit but should also be protected against any high voltages which may occur when the off-chip driver circuit is disabled and its output terminal is coupled to an external circuit operating at a higher supply voltage. It is desirable to provide this protection while minimizing the number of transistors and therefore the chip area utilized by the off-chip driver.

FIG. 1 is a circuit diagram of a known off-chip driver circuit 10. This circuit is described in U.S. Pat. No. 5,151,619 assigned to International Business Machines Corporation. The off-chip driver circuit 10 has first and second input terminals IN1 and IN2 which are connected to a pre-driver circuit (not shown). The off-chip driver circuit 10 is arranged to drive a signal received at the input terminals IN1 and IN2 to an output terminal OUT during an output mode. The off-chip driver circuit includes a first p-channel MOS transistor device 12 and a second n-channel MOS transistor device 14 which are serially arranged between a supply voltage Vdd and a point of reference potential Vss (which is typically at ground). The output terminal OUT is connected to a circuit node between the pull-up transistor 12 and the pull-down transistor 14. A pass gate 16 is formed by a n-channel transistor device 18 having its gate connected to the supply voltage Vdd and its drain/source path connected between the input terminal IN1 and the gate of the pull-up transistor 12. The n-channel transistor 18 acts in parallel with a p-channel transistor device 20 having its drain/source path connected to the same nodes and its gate connected to the output terminal OUT.

The pull-down transistor 14 has its gate connected to the second input terminal IN2. The off-chip driver circuit 10 includes a control transistor device 22 which has its gate connected to a control voltage Vref (typically equal to the source voltage Vdd) and its drain/source path connected in series between the pass gate p-channel transistor 20 and the output terminal OUT. The p-channel transistor 20 and the control transistor 22 are formed in a common n-well 26. An additional p-channel transistor device 24 has its gate connected to the terminal OUT to provide the supply voltage Vdd to bias the n-well 26 in certain conditions.

The off-chip driver circuit 10 has its output terminal OUT selectively connectable to an external circuit 28 which has a supply voltage Vcc and which is used in an input mode of the off-chip driver circuit 10 to supply signals to the chip via the output terminal OUT which is connected to an input signal line (not shown).

The voltage supply Vdd for the off-chip driver circuit 10 is typically about 3.3 volts+/−0.3 volts. However, the external circuit 28 may operate at a higher source voltage such as a conventional CMOS level of five volts. When used as an off-chip driver circuit, the circuit 10 should be capable of driving the output terminal OUT at zero volts to indicate a logical zero or 3.3 volts to indicate a logical one. However, when the circuit 10 is not driving out, it must be able to tolerate voltages as high as seven volts at the terminal OUT.

When the off-chip driver circuit is used in the output mode, the same signal level is applied at each of the first input terminal IN1 and the second input terminal IN2 to provide an output level at output terminal OUT. As is more fully discussed in the above-referenced U.S. Pat. No. 5,151,619, with the input terminals IN1 and IN2 low (typically ground), the voltage at the output terminal OUT is at the source voltage Vdd. With the input terminals IN1 and IN2 high (typically 3.3 volts), the voltage at the output terminal OUT is a low voltage (approximately ground). To disable the output mode of the off-chip driver circuit 10, the pre-driver circuit which furnishes input signals to the first and second input terminals IN1 and IN2 is tristated by driving the first input terminal IN1 high and the second input terminal IN2 low. In this condition, both the pull-up p-channel transistor 12 and the pull-down n-channel transistor 14 are off.

The circuit 10 of FIG. 1 is designed to receive signals at the terminal OUT when in this disabled condition. With a voltage of zero volts at the output terminal OUT, the pass gate p-channel transistor 20 is turned on and passes the 3.3 volts present on the first input terminal IN1 to the gate of the pull-up transistor 12, turning the transistor 12 off. Thus, there is no leakage current through the pull-up transistor 12. When a high voltage, for example five volts, is applied to the output terminal OUT by the external circuit 28, the p-channel pass gate transistor 20 is turned off. However, the p-channel control transistor 22 is turned on because the voltage applied at its source exceeds the control voltage Vref (3.3 volts) at its gate. The path through the transistor 22 furnishes the voltage at the output terminal OUT to the gate of the pull-up p-channel transistor 12, turning it off. In this condition, the voltages at the gate and the source of the p-channel transistor 12 are approximately the same; and, consequently, the oxide of the p-channel transistor 12 is not subject to any significant stress. Therefore, in the disabled condition when the likely extreme values of voltages are imposed by the external circuit 28, the prior art circuit 10 of FIG. 1 works well.

However, problems arise both when voltages at the terminal OUT are at middle values between the extremes and during transition states. When the value of the voltage at the terminal OUT is in a range between the reference voltage (Vref) minus the p-channel threshold voltage (Vpt) and Vref plus Vpt, neither the pass gate transistor 20 nor the control transistor 22 is on. In this range, the voltage at the gate of the pull-up transistor 12 is not tracking either the supply voltage Vdd or the output voltage. This can cause leakage current to be referred to the input of the circuit 10 from the device 12. This leakage can cause specification violation in certain applications such as PCI drivers where the input leakage must be below seventy microamperes with the input in a range from zero to five volts.

For example, in order to turn the control transistor 22 on, the voltage at the output terminal OUT must be at least a threshold voltage Vpt above the control voltage Vref at the gate of the control transistor 22. If this condition is not satisfied, the control transistor 22 will remain off. If the voltage at the terminal OUT is slightly above or slightly below the reference voltage (normally 3.3 volts), the voltage is neither low enough to turn on the p-channel pass gate transistor 20 nor high enough to turn on the control transistor 22. Thus, both the transistors 20 and 22 are off. The n-channel transistor 18 of the pass gate will try and pull up the gate of the p-channel transistor 12, but it will be only able to pull it up to a threshold value Vnt below the voltage on the input IN1 (about 2.6/2.7 volts). This is inadequate to reliably turn off the pull-up p-channel transistor 12, and therefore there will be a leakage current through that transistor. Thus, with voltages at the terminal OUT closer than a threshold Vpt to the supply voltage Vdd, the prior art circuit 10 has a major disadvantage.

One solution to the problem is proposed in an article entitled "3.3 V–5 V Compatible I/O Circuit without Thick Gate Oxide" by Takahashi et al, IEEE 1992 Custom Integrated Circuits Conference 23.3.1–23.3.4. In that solution, different types of transistors are introduced to exclude undesirable leakage paths and to prevent oxide stress. This solution suffers from the disadvantage that it requires different fabrication techniques to produce the entire circuit, an expensive option.

Another problem displayed by the circuit 10 is that the p-channel device 12 does not provide any electrostatic discharge (ESD) clamping action for over-shoot conditions of any voltage present at the terminal OUT. Since the device 12 is held off under all over-shoot conditions of the voltage at the terminal OUT, the device 12 can not be used to clamp the output when electrostatic discharge occurs (in conventional output drivers the output devices and junction diodes are combined to reduce damage from electrostatic discharge). With this prior art circuit 10, additional devices (not shown) must be added to eliminate problems caused by electrostatic discharge; and this addition results in the circuit 10 occupying additional silicon area.

The circuit 10 also includes a method for isolating the n-well of the p-channel devices when the P+/N– diodes would otherwise be forwarded biased resulting in leakage current. P-channel transistor device 24 acts as a switch between the positive supply Vdd and the well bias source. The device 24 is directly controlled by the voltage at the terminal OUT and is disabled when the input voltage at the OUT terminal comes within a threshold voltage Vpt of the 3.3 volt source voltage therefore eliminating the leakage path to the well before the diodes can be forwarded biased. Since conduction by the device 24 is controlled directly by the voltage at the terminal OUT, care must be taken to protect the gate of the device 24 from electrostatic discharge damage. Such protection also adds extra circuitry to the silicon.

It is desirable to eliminate the range in which leakage current can occur in an off-chip driver circuit which receives input signals at its output terminal which input signals may have values greater than the internal source voltage of the driver circuit.

It is also desirable to provide protection against electrostatic discharge in an off-chip driver circuit without increasing the size of the circuit.

SUMMARY OF THE INVENTION

It is an object of the present invention to provide an off-chip driver circuit which overcomes the disadvantages of the prior art without significantly increasing the area required for the circuit.

This and other objects of the present invention are accomplished by an off-chip driver circuit having a set of input terminals and an output terminal, a pull-up transistor having a controllable path connected between a first power supply and the output terminal of the off-chip driver circuit, a pull-down transistor having a controllable path connected between a second power supply and the output terminal, a first controllable path for applying a first voltage at one of the input terminals to a control terminal of the pull-up transistor, the first controllable path functioning in response to voltages at the output terminal below a first value, and a second controllable path for applying a second voltage greater than the first voltage to the control terminal of the pull-up transistor, the second controllable path functioning in response to voltages at the output terminal above the first value.

These and other features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

The term "assert" as applied to a signal indicates that signal is active independent of whether the level of the signal is low or high. The term "de-assert" indicates that a signal is inactive.

DETAILED DESCRIPTION

Figure 1:
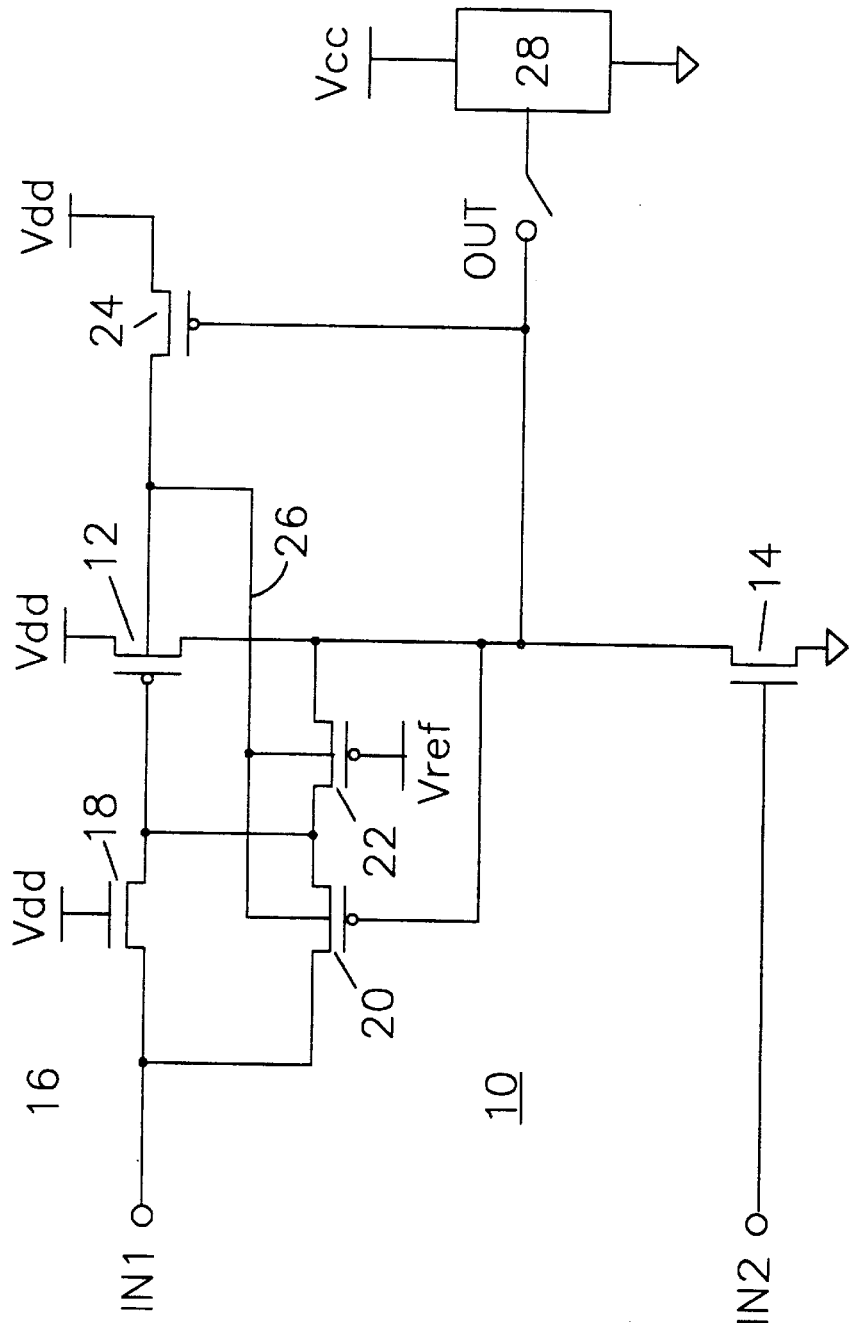
FIG. 1 is a circuit diagram of a prior art off-chip driver circuit.
Figure 2:
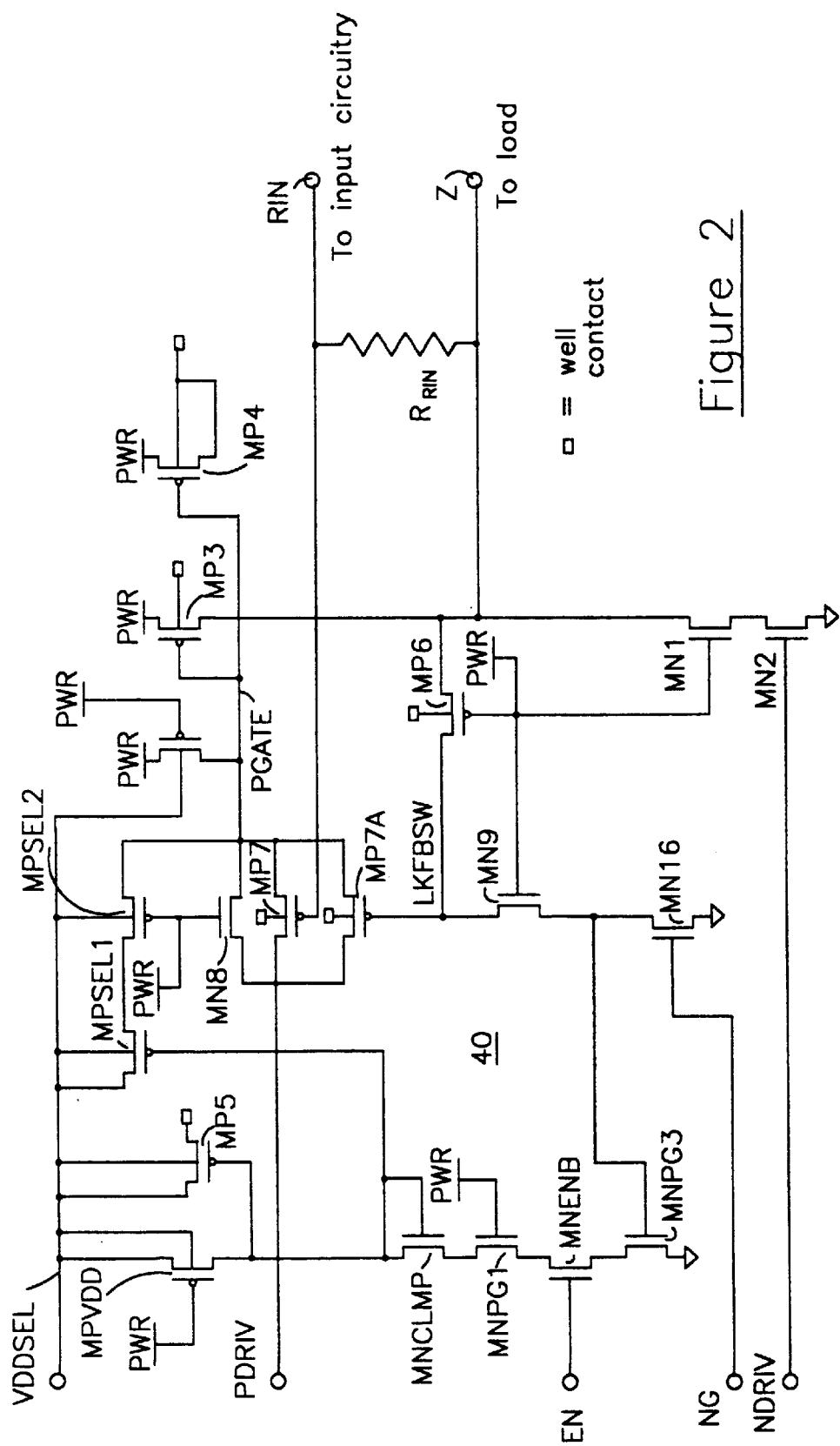
FIG. 2 is a circuit diagram of an off-chip driver circuit in accordance with the present invention.

Referring now to FIG. 2, there is illustrated a block diagram of an off-chip driver circuit 40 constructed in accordance with the present invention. The off-chip driver circuit 40 receives input at a pair of input terminals PDRIV and NDRIV and provides output at an output terminal Z when an enable signal EN is deasserted low. The output terminal Z may be connected to circuitry such as the circuit 28 illustrated in FIG. 1 which is also adapted to provide input to the circuit 40 at the terminal Z. As with the circuit of FIG. 1, the circuit 40 is adapted to provide output signals in an output mode of high (typically 3.3 volts) and low (typically ground) values at the output terminal Z depending on the condition of the input signals applied at the terminals PDRIV and NDRIV. When a high valued input signal (typically 3.3 volts) is applied at both of the terminals PDRIV and NDRIV, a n-channel transistor device MN2 is enabled as is a n-channel device MN1; and a p-channel transistor device MP3 is disabled causing ground to be applied through the devices MN1 and MN2 at the output terminal Z. Alternatively, when a low valued input signal (typically ground) is applied at both of the terminals PDRIV and NDRIV, the n-channel transistor device MN2 is disabled; and the p-channel transistor device MP3 is enabled causing PWR (typically 3.3 volts) to be applied at the output terminal Z. This causes the circuit 40 to provide the two desired output signals at the output terminal Z.

In the mode in which the circuit 40 is not used to drive signals off of the chip but instead receives input signals at the terminal Z from external circuitry which are transferred at a terminal RIN to input circuitry (not shown), the terminals PDRIV and NDRIV are tristated by the application of disabling voltages (typically values of 3.3 volts and ground, respectively). At the same time, the signal EN is asserted providing a high value (typically 3.3 volts) at the gate of a n-channel transistor device MNENB. At the same time, the voltage supply (typically 5 volts) of the external circuit which is furnishing input signals at the terminal Z is maintained at a terminal VDDSEL. The high value EN signal enables a feedback path through the n-channel transistor device MNENB for response to the voltage at the terminal Z. The operation of the feedback path is described below.

So long as any input voltage at the terminal Z is below the value of the power source PWR (typically 3.3 volts) plus a threshold value Vpt of a p-channel device, the voltage PWR at its gate terminal disables a p-channel device MP6. As long as the device MP6 is disabled, ground is applied to the gate of a p-channel transistor device MP7A through a path including a n-channel transistor device MN9 and a n-channel transistor device MN 16. The device MN9 is held on by the voltage PWR at its gate terminal. The device MN16 is a weak n-device biased on by a value NG at its gate sufficient to allows it to conduct only weakly. The leakage current during this tristate mode is typically limited to below 70 uA when being driven by a high voltage driver between 0.4 and 2.7 volts.

Ground at the gate of the device MP7A enables that device allowing it to transfer the value (typically 3.3 v.) furnished at the terminal PDRIV to a node PGATE. The high value at the node PGATE is applied at the gate terminal of the device MP3 and holds the device MP3 off positively.

For voltages at terminal Z below the source value PWR minus a threshold value Vpt, a p-channel transistor device MP7 is also ON aiding the maintenance of 3.3 volts at the node PGATE. For voltages above 3.3 volts minus Vpt, the device MP7 is disabled.

Any input signal at the output terminal Z is applied at the source terminal of the p-channel transistor device MP6. If the input signal rises to a value greater than PWR plus a threshold value Vpt (approximately 4 volts), it causes the device MP6 to conduct and raise the voltage at a node LKFBSW to just less than that at the terminal Z. As this voltage rises, the device MP7A begins to turn off.

A voltage greater than the source value PRW at the node LKFBSW assures that n-channel transistor device MN9 with the voltage PWR at its gate terminal conducts. However, since the weak device MN16 has its gate biased by a value NG sufficient to allow it to conduct only weakly, the voltage at the node between the devices MN16 and MN9 rises from ground. As this voltage rises, a n-channel device MNPG3 turns on. Not only does the device MP7A begin to turn off as the voltage at its gate rises, the device MP7 is also disabled by the high voltage at the terminal Z which is applied through a resistor $R_{RIN}$ at its gate terminal. As the device MP7 turns off and the device MP7A begins to turn off, the voltage at the terminal PDRIV which has been holding the device MP3 off is gradually isolated from the node PGATE.

However, as the device MP7A is turning off, the device MNPG3 is turning on due to the rise of the voltage at its gate. The feedback path enabling device MNENB has a high value at its gate and is also on, so the voltage at the source terminal of a n-channel device MNPG1 is lowered. The device MNPG1 has PWR applied at its gate terminal so its also turns on lowering the voltage at the source terminal of a n-channel device MNCLMP. The device MNCLMP turns on lowering the voltage at the gate of a p-channel transistor device MPSEL1. The low voltage at its gate turns on the device MPSEL1 furnishing essentially the value VDDSEL (five volts) at the drain of a p-channel device MPSEL2 which has the voltage PWR applied at its gate. The device MPSEL2 similarly turns on and furnishes essentially five volts at the node PGATE.

At essentially the same time, the device MP7A has completed turning off as its gate terminal has risen toward Z above the value PWR plus Vpt. This disables one path from the input terminal PDRIV to the node PGATE. An n-channel device MN8 is also off because its gate and source are each at the value PRW. Consequently, the node PGATE becomes isolated from the terminal PDRIV just as the five volts VDDSEL is applied at the node PGATE.

The voltage at the node PGATE is applied at the gate of the p-channel transistor device MP3 which has the voltage PWR at its source and a value just over four volts at its drain. This turns the device MP3 off allowing the voltage at the terminal Z to rise.

Thus, as the voltage at the terminal Z rises above PWR plus Vpt (above approximately 4 volts), the device MP6 functions as a voltage level detector causing the devices MP7 and MP7A to turn off and the devices MPSEL1 and MPSEL2 to simultaneously turn on. Turning off the devices MP7 and MP7A removes the lower voltage level PWR (3.3 volts) from the gate of the device MP3 while turning on the devices MPSEL1 and MPSEL2 simultaneously applies 5 volts at that gate terminal. This arrangement guarantees that the device MP3 stays off during the transition of the voltage at the terminal Z in contrast to the prior art. The device MP7A acts to ensure that the voltage on node PGATE does not leak down and turn on the device MP3. This is accomplished in the manner described by maintaining the voltage PWR from the terminal PDRIV at the node PGATE through the devices MP7 and MP7A while the voltage at terminal Z is low and then turning off first the device MP7 and then the device MP7A as the voltage rises. The device MP7A is turned off just as the higher voltage VDDSEL is applied to the node PGATE. This guarantees that the node PGATE is positively controlled so that the device MP3 will remain off until the voltage on Z exceeds the normal range of the input signal (e.g., a threshold voltage Vpt above five volts). In this manner, the leakage present in this middle range in the prior art circuit of FIG. 1 is eliminated.

The value at the terminal Z may rise until its value is a threshold amount Vpt above the five volts applied at the gate terminal of the device MP3. When the voltage at the terminal Z reaches this point, the device MP3 turns on and provides a drain to the source terminal of the device MP3 (held at the voltage PWR) for current generated by the voltage at the terminal Z. The device MP3 begins clamping the voltage at the terminal Z to limit its swing. In addition, the device MP3 provides a path for discharging any electrostatic voltage which might be applied to the circuit without requiring additional circuitry as is required in the prior art.

Once the voltage at the terminal Z goes above five volts plus a threshold Vpt, device MP3 will turn on and start to clamp the output signal. As the voltage on the terminal Z rises higher, the device MP3 conducts more strongly as the voltages Vds and Vgs are continually trying to increase. The same effect will be seen during electrostatic discharge testing when the device MP3 also acts as a clamp.

On the other hand, when the voltage at terminal Z drops below PWR plus Vpt, the device MP6 is disabled. This causes the gate of the device MNPG3 to drop disabling the path through the devices utilized to provide an enabling voltage at the gate of the device MPSEL1 by which five volts is transferred to the node PGATE. At the same time, the devices MP7 and MP7A are enabled so that PWR is again furnished at PGATE disabling the device MP3. Thus the drop of the potential at the terminal Z switches the voltage at the node PGATE from 5 volts to 3.3 volts. When the off-chip driver circuit 40 is enabled (EN is deasserted low), the feedback path through the device MNENB is turned off; and the device MP3 acts as a normal clamping device (i.e., clamps when the voltage at the terminal Z exceeds the 3.3 volt supply by a p-channel threshold value Vpt).

The present invention obviates a number of problems of the prior art. The invention tolerates voltages above the maximum value of the voltage source PWR (typically 3.6 volts) at the terminal Z. While the voltage at the output terminal may rise as high 6–7 volts with a clamping circuit as in the prior art circuit of FIG. 1, the typical forms of clamping to the voltage of the source PWR cannot be used because the p+ and n-well junction diodes cannot ever be forward biased. The well must be isolated when the output is tristated and is acting to receive input signals. All source-to-drain voltages on output transistors must be limited not to exceed a specified maximum voltage. All gate-to-drain/source/bulk voltages also must be limited. This is accomplished in the present invention.

A p-channel transistor device MP4 and a p-channel transistor device MP5 are utilized to provide biasing for the well of the various devices in the circuit 40 to eliminate the possibility of diode action through the well at high input voltages. When a low voltage is applied to the node PGATE, the device MP4 is enabled and transfers the value PWR to bias the well. When, however, the voltage at the node PGATE is five volts, the device MP4 is disabled while the device MP5 is enabled. This disconnects the lower value PWR from the well and isolates the well from the voltage at the terminal Z. At the same time, it connects the five volts available at VDDSEL to the well to eliminate forward biasing of the diode between the drain of the device MP4 and the well.

The n-channel devices MN1 and MN2 are protected by having two devices in series. Since the input value at Z is divided across the devices MN1 and MN2, the values across any two terminals of the transistor devices are kept below breakdown values. With this configuration the voltage on the source of MN1 will never exceed the voltage PWR, therefore protecting MN2 from the high voltage condition. MN1 protects itself by allowing its source to rise when the output rises thus keeping the drain/source voltage below the voltage PWR. With its gate tied to the voltage PWR, the gate to drain/source voltage limit may not be exceeded.

Clamping to the voltage PWR cannot occur when the device is tristated (EN is asserted high) and the input at the terminal Z is between zero and five volts but can occur when the driver is enabled (e.g. over-shoot on output reflections). In order to clamp under these conditions, the over-voltage detection is turned off by lowering the voltage at the gate of the device MNENB. This will cause the output to clamp when the voltage on the drain of the device MP3 exceeds a p-channel threshold (e.g. 3.3 plus Vpt volts). Therefore, output clamping and electrostatic discharge protection will occur by the operation of the device MP3 when the output is driven high and by MN2 when the output is driven low.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. An off-chip driver circuit having output clamping and electrostatic discharge protection, comprising:

first and second input terminals for receiving input signals having either a first voltage or a second voltage, an enable input terminal for receiving either an enable signal or disable signal, first and second power supply terminals, and an output terminal at which drive signals are generated, said output terminal also being capable of receiving signals from external circuitry and transferring such signals to other input circuitry;

a first pull-up transistor having a first control terminal, said pull-up transistor being operatively disposed in a first controllable path for connecting a third voltage from a first power supply to said output terminal;

a pull-down transistor having a second control terminal, said pull-down transistor being operatively disposed in a second controllable path for connecting said output terminal to a circuit ground; and control circuitry coupled to said enable input terminal, to said first and second input terminals, to said output terminal, to said first and second control terminals, to said first power supply terminal for connection to said first power supply, and to said second power supply terminal for connection to a second power supply having a fourth voltage greater than said third voltage, said control circuitry being operative to cause said driver circuit to operate in a first mode when a disable signal is applied to said enable input terminal, and to operate in a second mode when an enable signal is applied to said enable terminal, said control circuitry being operative in said first mode, and in response to signals of said first voltage applied to said first and second input terminals, to enable said pull-down transistor and disable said pull-up transistor thereby pulling said output terminal to ground thereby generating a drive signal of a first state, said control circuitry being further operative in said first mode, and in response to input signals of said second voltage applied to said first and second input terminals, to enable said pull-up transistor and to disable said pull-down transistor thereby pulling said output terminal up to said third voltage thereby generating a drive signal of a second state, said control circuitry being operative in said second mode, with the input of said first voltage to said first input terminal and the input of said second voltage to said second input terminal, to cause said pull-up transistor and said pull-down transistor to both be disabled, said control circuitry being further operative in said second mode to sense the voltage at said output terminal and to apply and maintain the application of said first voltage to said first control terminal so long as any voltage externally applied to said output terminal is below said third voltage plus a threshold value, but if the voltage externally applied to said output terminal should exceed said third voltage plus a threshold value then said control circuitry is operative to couple said second power supply terminal to said first control terminal to apply said fourth voltage thereto to thereby ensure that said pull-up transistor remains disabled.

2. An off-chip driver circuit as recited in claim 1 wherein said control circuitry includes:
    a voltage level detector responsive to voltages at the output terminal and operative to switch between a first state and a second state, said first state causing said control circuitry to connect said first input terminal to the control terminal of the pull-up transistor; and
    a feedback circuit responsive to said second state and operative to disconnect said first input terminal from said first control terminal, and to connect said second power supply terminal to said first control terminal of the pull-up transistor.

3. An off-chip driver circuit as recited in claim 2 wherein the connection of said first input terminal to the control terminal of the pull-up transistor includes first and second branches that are disabled at different rates as the voltage at said output terminal changes from below said third voltage plus a threshold value to above said threshold value.

4. An off-chip driver circuit as recited in claim 2 in which said detector disables said first means while enabling said feedback circuit.

5. An off-chip driver circuit as recited in claim 1 and further comprising a circuit for selectably biasing a body portion of the pull-up transistor in a manner corresronding to a voltage level applied at the output terminal.

6. An off-chip driver circuit as recited in claim 1 wherein said circuit means includes a switching device having a control terminal connected to said control circuitry, said switching device being operative to enable said feedback circuit when an input signal at the voltage level of said first power supply is applied to said fourth input terminal, and to disable said feedback circuit when an input signal at the voltage level of said second power supply is applied to said fourth input terminal.

7. An off-chip driver circuit as recited in claim 6 wherein said driver circuit is operated in a second mode when said first and second input terminals are tristated by the application of the same input voltage thereto and when said feedback circuit is enabled by the input to said fourth input terminal of a voltage at the level of said first power supply.

8. An off-chip device circuit as recited in claim 7 and further comprising:
    a fifth terminal coupled to said output terminal and said circuit means, said driver circuit being operative to transfer external signals input at said output terminal to said fifth terminal for input to other circuitry.

9. An off-chip driver circuit comprising:
    a source of voltage of a first level;
    a source of voltage of a second level less than the first level;
    an input/output terminal;
    a first controllable path between the source of voltage of the first level and the input/output terminal;
    a second controllable path between the source of voltage of the second level and the input/output terminal;
    a first terminal for furnishing first input signals to enable and disable the first controllable path in an enabled condition of the off-chip driver circuit;
    a second terminal for furnishing second input signals to enable and disable the second controllable path in an enabled condition of the off-chip driver circuit;
    a circuit for rendering the first controllable path substantially non-conductive so as to allow third input signals to be provided at the input/output terminal, the circuit including:
        means for protecting the first controllable path if a voltage of a level higher than voltages of the first level appears at the output terminal, said means including circuit means responsive to a voltage level at the input/output terminal for increasing a control voltage furnished to render the first controllable path substantially nonconductive; and
        means for assuring that the first controllable path remains substantially non-conductive if a voltage of a level essentially equal to the first level appears at the output terminal.

10. An off-chip driver circuit as recited in claim 9 in which the means for assuring that the first controllable path remains substantially nonconductive if a voltage of a level essentially equal to the first level appears at the input/output terminal includes means responsive to a voltage level at the input/output terminal for providing a voltage from the first source to render the first controllable path substantially nonconductive.

11. An off-chip driver circuit as recited in claim 9 wherein the circuit for rendering the first controllable path nonconductive includes means for providing biasing means to the first controllable path of the first level when a voltage level at the input/output terminal is below the first level and for providing biasing means to the first controllable path of a higher level when a voltage level at the input/output terminal is above the first level.

12. A method for protecting an output driver transistor of an input/output off-chip driver circuit comprising the steps of:
    detecting a voltage level provided at an input/output terminal of the off-chip driver circuit during a mode in which the off-chip driver circuit is receiving input signals at the input/output terminal,
    providing a control voltage of a first level to a control terminal of an output driver transistor of the off-chip driver if the voltage level provided at an input/output terminal of the off-chip driver circuit is less than a first level, and providing a control voltage of a level greater than the first level to the control terminal of the output driver transistor if the voltage level provided at an input/output terminal of the off-chip driver circuit is greater than a first level.

13. A method for protecting an output driver transistor of an input/output off-chip driver circuit as recited in claim 12 wherein the steps of providing a control voltage of a first level and providing a control voltage of a greater level are accomplished by connecting the control terminal to corresponding different voltage sources.

14. A method for protecting an output driver transistor of an input/output off-chip driver circuit as claimed in claim 13 further comprising the steps of:

biasing a body diode of a driver transistor at a first level when a voltage level at the input/output terminal is below the first level, and biasing the body diode of a driver transistor at a higher level when a voltage level at the input/output terminal is above the first level.

15. An off-chip driver circuit for providing signals at an input/output terminal comprising:

a p-channel pull up device for providing a high voltage level to the input/output terminal;

an n-channel pull down device for providing a low voltage level to the input/output terminal;

a first input circuit for controlling the p-channel device;

a second input circuit for controlling the n-channel pull down device;

a third input circuit for alternatively controlling the p-channel pull up device; and circuit means for selecting the first input circuit to control the p-channel pull up device when signals input to said input/output terminal are below the high voltage level, and for selecting the third input circuit to control the p-channel pull up device when signals input to said input/output terminal are above the high voltage level, said circuit means including a feedback circuit for disabling the first circuit and for enabling the third input circuit in response to a voltage at the input/output terminal rising above the high voltage level, and for disabling the third input circuit and enabling the first circuit in response to a voltage at the input/output terminal falling below the high voltage level.

16. An off-chip driver circuit as recited in claim 15 further comprising circuit means for biasing a body of the p-channel pull up device at the high voltage level when a voltage at the input/output terminal is below the high voltage level, and for biasing the body of the p-channel pull device at a higher voltage level when a voltage at the input/output terminal is above the high voltage level.

* * * * *